(12) United States Patent
Simonelli et al.

(10) Patent No.: US 6,201,319 B1
(45) Date of Patent: *Mar. 13, 2001

(54) UNINTERRUPTIBLE POWER SUPPLY

(75) Inventors: James M. Simonelli, Grafton; Damir Klikic, Waltham; Michael J. Ingemi, Norwood, all of MA (US); Donald L. Charlantini, Nashua, NH (US); David A. Colucci, Melrose, MA (US)

(73) Assignee: American Power Conversion, West Kingston, RI (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/384,042

(22) Filed: Aug. 26, 1999

Related U.S. Application Data

(63) Continuation of application No. 09/115,346, filed on Jul. 14, 1998, now Pat. No. 5,982,652.

(51) Int. Cl.⁷ .......................................................... H02J 3/02
(52) U.S. Cl. ................................................. 307/26; 307/66
(58) Field of Search ............................. 363/142; 307/26, 307/66

(56) References Cited

U.S. PATENT DOCUMENTS

| | | |
|---|---|---|
| 4,366,390 | 12/1982 | Rathmann . |
| 4,608,499 | 8/1986 | Rathmann . |
| 4,782,241 | * 11/1988 | Baker ..................................... 307/66 |
| 5,184,025 | 2/1993 | McCurry et al. . |
| 5,260,864 | 11/1993 | Simonelli et al. . |
| 5,274,808 | 12/1993 | Miyao et al. . |
| 5,291,383 | 3/1994 | Oughton . |
| 5,384,792 | 1/1995 | Hirachi . |
| 5,457,600 | 10/1995 | Campbell et al. . |
| 5,596,479 | 1/1997 | Campbell et al. . |
| 5,677,831 | 10/1997 | Lin . |
| 5,686,768 | 11/1997 | Thomsen et al. . |
| 5,694,312 | 12/1997 | Brand et al. . |
| 5,764,503 | 6/1998 | Brand et al. . |

* cited by examiner

*Primary Examiner*—Shawn Riley
(74) *Attorney, Agent, or Firm*—Mintz, Levin, Cohn, Ferris, Glovsky and Popeo, P.C.

(57) ABSTRACT

A power supply system has a power input to receive input power from a power source, a power output to provide output power to a load, at least one battery module having a battery output that provides battery power, at least one power module coupled to the power input to receive the input power, coupled to the battery output to receive the battery power and coupled to the power output to provide the output power, a controller, coupled to the at least one power module, constructed and arranged to monitor and control the output power from the at least one power module, and a redundant controller, coupled to the at least one power module and to the controller, constructed and arranged to provide redundant monitoring and controlling of the output power from the at least one power module.

20 Claims, 13 Drawing Sheets

| Is RIM Ok ? | Are main processor and slave processor Ok ? | Am I in control |
|---|---|---|
| No | No | Yes |
| No | Yes | Yes |
| Yes | No | No |
| Yes | Yes | Yes |

Fig. 11

| Is MIM Ok ? | Am I Ok ? | Am I in control |
|---|---|---|
| No | No | No |
| No | Yes | Yes |
| Yes | No | No |
| Yes | Yes | No |

Fig. 12

UNINTERRUPTIBLE POWER SUPPLY

This application is a continuation application under 37 CFR §1.53(b) of U.S. Ser. No. 09/115,346, filed on Jul. 14, 1998 now U.S. Pat. No. 5,982,652.

FIELD OF THE INVENTION

The present invention relates generally to a method and apparatus for providing uninterruptible, regulated power to critical and/or sensitive loads. More specifically, the present invention relates to a modular uninterruptible power supply (UPS) having redundant systems to prevent single point failures and to ensure power system availability for the critical and/or sensitive loads.

DISCUSSION OF THE RELATED ART

The use of uninterruptible power supplies having battery back-up systems to provide regulated, uninterrupted power for sensitive and/or critical loads, such as computer systems, and other data processing systems is well known. FIG. 1 shows a typical prior art UPS 10 used to provide regulated uninterrupted power. The UPS 10 includes an input circuit breaker/filter 12, a rectifier 14, a control switch 15, a controller 16, a battery 18, an inverter 20 and an isolation transformer 22. The UPS also includes an input 24 for coupling to an AC power source and an outlet 26 for coupling to a load.

The UPS 10 operates as follows. The circuit breaker/filter 12 receives input AC power from the AC power source through the input 24, filters the input AC power and provides filtered AC power to the rectifier 14. The rectifier converts the filtered AC power to DC power having a -predefined voltage value. The control switch 15 receives the DC power from the rectifier and also receives DC power from the battery 18. The controller 16 determines whether the DC power available from the rectifier is within predetermined tolerances, and if so, controls the control switch to provide the DC power from the rectifier to the inverter 20. If the DC power from the rectifier is not within the predetermined tolerances, which may occur because of "brown out" or "black out" conditions, or due to power surges, then the controller controls the control switch to provide the DC power from the battery 18 to the inverter 20.

The inverter 20 of the prior art UPS 10 receives DC power from the controller 16, converts the DC power to AC power, and regulates the AC power to predetermined specifications. The inverter 20 provides the regulated AC power to the isolation transformer 22. The isolation transformer is used to increase or decrease the voltage of the AC power from the inverter and to provide electrical isolation between a load and the UPS. Depending on the capacity of the battery and the power requirements of the load, the UPS 10 can provide power to the load during brief power source "dropouts" or for extended power outages.

In some prior art systems, the controller, the control switch and/or the battery may also contain circuitry to charge the battery using the DC power supplied by the rectifier. In addition, in some prior art systems, the controller provides operating status information to a user, either locally using, for example, indicating lights or a display system, or remotely by communicating with an external monitoring device.

There are several drawbacks associated with the prior art system shown in FIG. 1. First, the system shown in FIG. 1 is not scalable to accommodate increases in load power requirements. In typical data processing facilities that utilize UPS's, the power requirements typically increase over time as data processing equipment is expanded or upgraded, and if the UPS is not expandable, then it is often times replaced with a larger, more expensive model. Second, typical prior art UPS's have several single point failure mechanisms, the occurrence of which may disable the UPS and leave the load susceptible to power disturbances.

One prior art UPS system, disclosed in U.S. Pat. No. 5,694,312 to Brand et al., provides a modular system to accommodate changing load requirements. However, the system disclosed in Brand et al., like the prior art system 10, has several single point failure mechanisms which reduces the availability, of the UPS, and therefore, reduces the power protection provided to the load. In particular, a failure of the control circuitry in either the UPS 10, described above, or in the UPS system disclosed by Brand et al., may result in a complete failure of the UPS.

SUMMARY OF THE INVENTION

Embodiments of the present invention overcome the drawbacks of the prior art by providing a fully scalable, modular UPS system with redundant control circuitry to increase the availability of the UPS, and reduce the UPS system's susceptibility to single point failures.

In one general aspect, the invention features a power supply system including a power input to receive input power from a power source, a power output to provide output power to a load, at least one battery module having a battery output that provides battery power, at least one power module coupled to the power input to receive the input power, coupled to the battery output to receive the battery power and coupled to the power output to provide the output power, a controller constructed and arranged to monitor and control the output power from the at least one power module, and a redundant controller, coupled to the at least one power module and to the controller, constructed and arranged to provide redundant monitoring and controlling of the output power from the at least one power module. The redundant controller can be constructed and arranged to monitor and control the output power from the at least one power module upon failure of the controller. The at least one power module, the controller and the redundant controller can be constructed and arranged such that one of the controller and the redundant controller regulates the output power from the at least one power module. The at least one power module, the controller and the redundant controller can be constructed and arranged such that one of the controller and the redundant controller provides phase synchronization for the output power from the at least one power module. The at least one power module can include circuitry to regulate the output power to predetermined levels. The controller and the redundant controller can be constructed and arranged to allow the redundant controller to monitor operation of the controller, and to assume control of the at least one power module upon detection of a fault in the controller. The controller can include a main processor and a slave processor coupled to the main processor, the redundant controller can include a redundant processor coupled to the main processor in the controller, and the main processor can be constructed and arranged to determine an operational state of the power supply system and to provide control signals to the slave processor and the redundant processor indicative of the operational state. The slave processor can be substantially identical to the redundant processor. The power supply system can include control lines from the controller to the at least one power module and control lines from the redundant controller to the at least one power module, and the at least one power module can be constructed and arranged to respond to either the control lines from the controller or the control lines from the redundant controller based on operational states of the controller and the redundant controller. The at least one power module can be a plurality of power modules and the at least one battery can be a plurality of batteries. Each of the power modules can be constructed and arranged to select one of the battery power or the input power as a source for generating the output power.

In another general aspect, the invention features a power supply system that includes a power input to receive input power from a power source, a power output to provide output power to a load, at least one battery module having a battery output that provides battery power, means for generating the output power using one of the input power and the battery power, means for monitoring and controlling the output power generated by the means for generating, and redundant means for monitoring and controlling the output power generated by the means for generating.

The redundant means for monitoring and controlling can include means for detecting a fault in the means for monitoring and controlling, and means for assuming control of the output power upon detection of the fault. The redundant means for monitoring and controlling can include a first processor, and the means for monitoring and controlling the output power can include a second processor, means for detecting an operational state of the power supply system, and means for communicating the operational state to the first processor and to the second processor. The means for generating can include means for selecting one of the means for monitoring and controlling and the redundant means for monitoring and controlling as a control source for controlling characteristics of the output power.

In another general aspect, the invention features a method used in a power supply system having at least one battery module that provides battery power, at least one power module that provides output power, a controller that monitors and controls the output power, and a redundant controller. The method includes steps of detecting a fault in the controller, and transferring control of the output power from the controller to the redundant controller.

The power supply system can have a plurality of operational states, and the method can further include steps of detecting the operational state of the power supply system, and communicating the operational state to the controller and the redundant controller. The power supply system can further include a communication card to allow communications with external devices, and the method can further include a step of transferring a data source for external communications from the controller to the redundant controller when control of the output power is transferred from the controller to the redundant controller.

DESCRIPTION OF THE DRAWINGS

For a better understanding of the present invention, reference is made to the drawings which are incorporated herein by reference and in which:

FIG. 11 is a logic truth table for a processor used in the main intelligence module shown in FIG. 8;

FIG. 12 is a logic truth table for a processor used in the redundant intelligence module shown in FIG. 9.

DETAILED DESCRIPTION OF AN ILLUSTRATED EMBODIMENT

Illustrative embodiments of the present invention will be described below with specific reference to a modular, scalable uninterruptible power supply (UPS) system having a redundant control system. However, embodiments of the present invention are not limited to modular and/or scalable UPS systems.

Preferred Embodiments of the present invention are implemented in Symmetra™ Power Array™ UPS systems available from American Power Conversion Corporation, of West Kingston, R.I.

Figure 1:
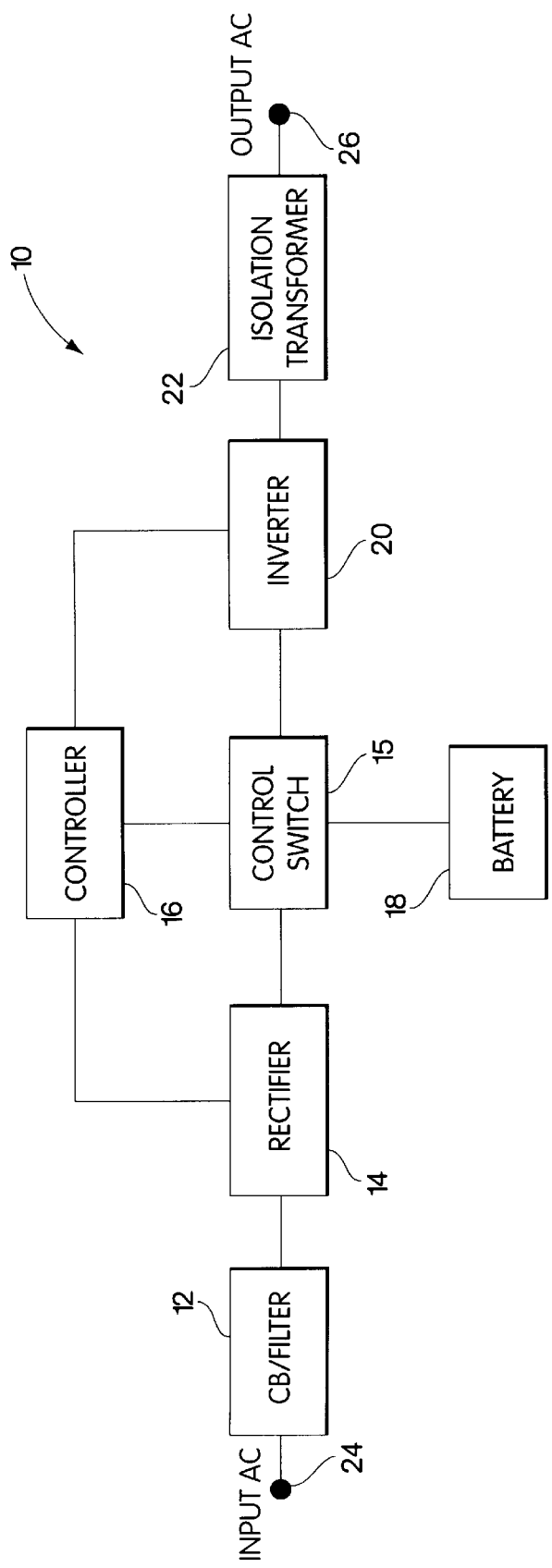
FIG. 1 shows a block diagram of a prior art UPS system.
Figure 2:
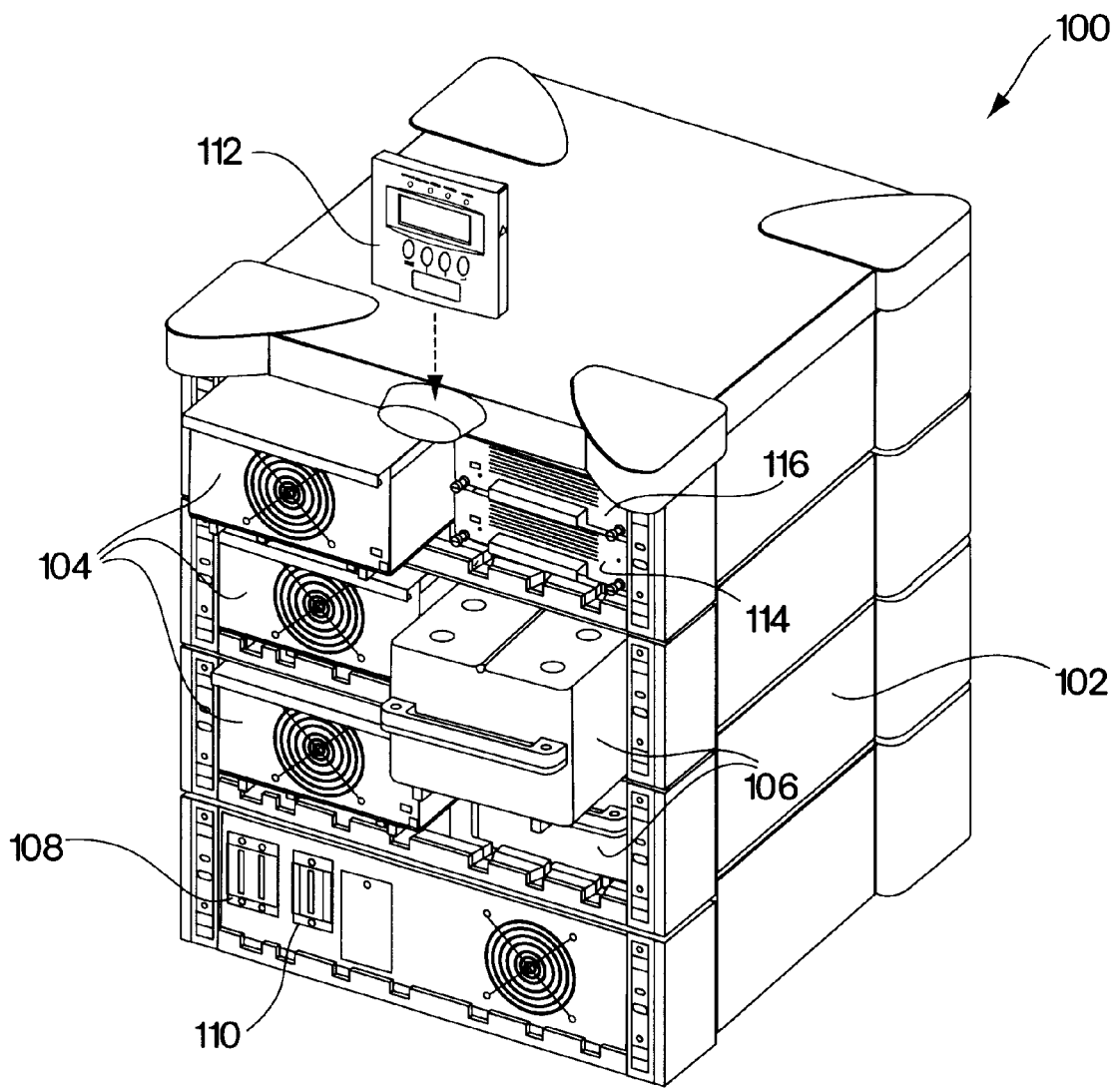
FIG. 2 shows a front perspective view of a UPS system in accordance with one embodiment of the present invention.

FIG. 2 shows a perspective view of a UPS system 100 in accordance with one embodiment of the present invention. The UPS system 100 includes a number of components housed within a chassis 102. The primary components of the UPS system include power modules 104, battery modules 106, a circuit breaker 108, a bypass switch 110, a display module 112, a main intelligence module (MIM) 114, a redundant intelligence module (RIM) 116, and an output power transformer (not shown in FIG. 2). As shown in FIG. 2, the power modules 104 and the battery modules 106 are removable through the front of the chassis 102. In addition, the main intelligence module 114 and the redundant intelligence module 116 may also be removed through the front of the chassis. In one embodiment of the present invention, the chassis includes a number of grill covers (not shown), mountable to the front of the chassis. The grill covers are used primarily for aesthetic purposes, however, they also protect the components from damage and properly direct air flow through the components for cooling.

Figure 3A:
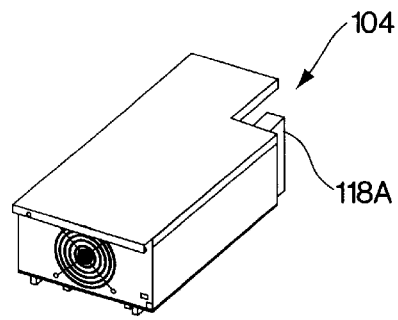
FIGS. 3A, 3B and 3C respectively show perspective views of a power module, a battery module, and a main intelligence module used in the UPS system of FIG. 2.
Figure 3B:
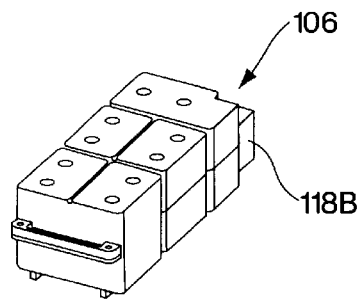
Figure 3C:
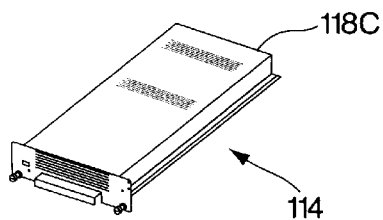

FIGS. 3A, 3B and 3C respectively show perspective views of one of the power modules 104, one of the battery modules 106, and the main intelligence module 114, with each of the modules removed from the chassis 102. The external chassis of the redundant intelligence module 116 is substantially identical to that of the main intelligence module shown in FIG. 3C. As shown in FIGS. 3A, 3B and 3C, each of the modules includes a blind mating connector 118A, 1181 or 118C to electrically couple the module to buses and/or cables within the chassis 102 to provide interconnection with the other modules.

Figure 4:
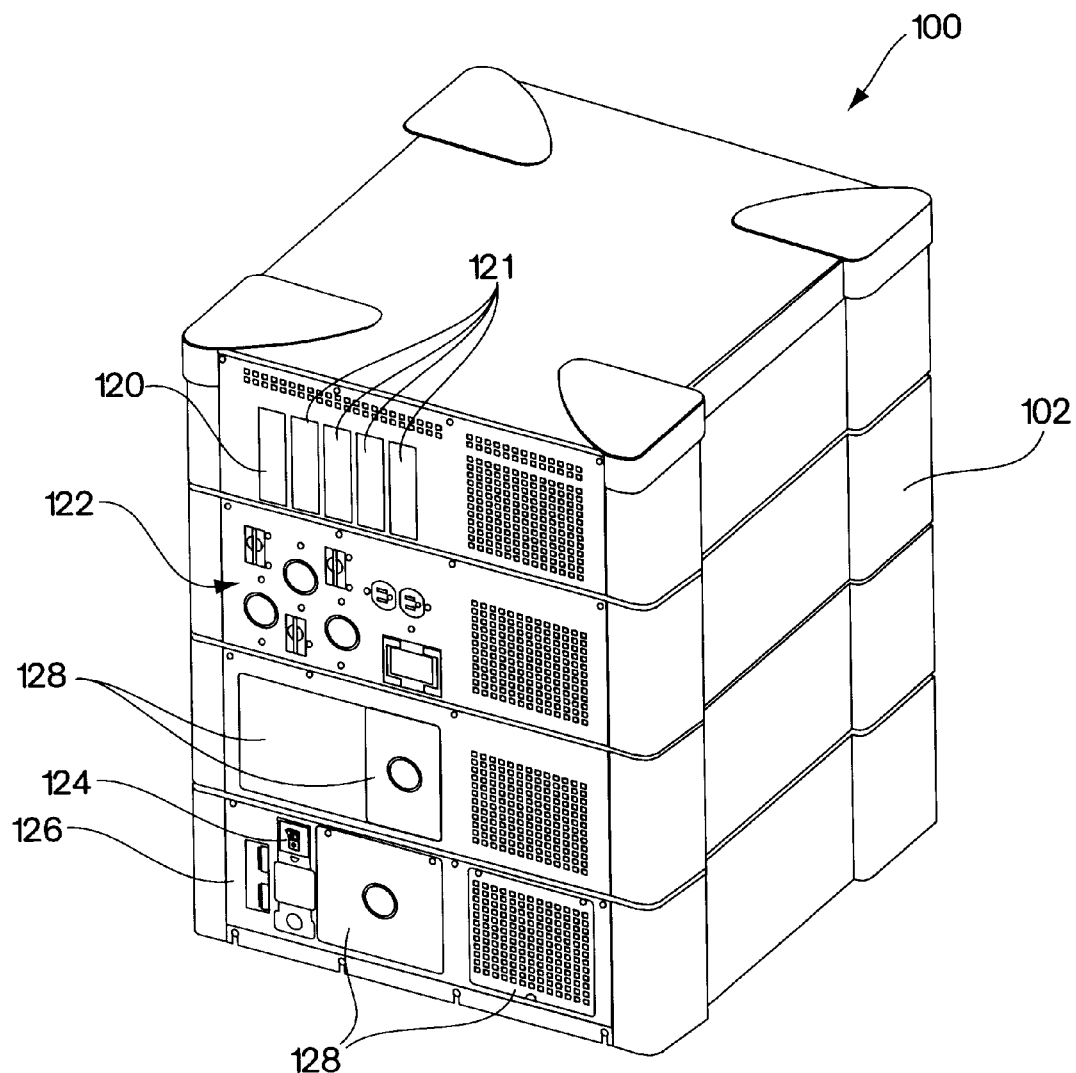
FIG. 4 shows a rear perspective view of the UPS system of FIG. 2.

FIG. 4 shows a perspective view of the rear of the UPS system 100. Mounted on the rear of the chassis 102 are communication ports 120, communication card adapter slots 121, a power distribution unit 122, an enable switch 124, a battery extension connector 126, and access panels 128. The output transformer is located behind the battery extension connector 126. The communication ports 120 allow the UPS system 100 to communicate with external devices, and the communication card adapter slots are designed to accommodate optional communication cards as discussed below. The power distribution unit 122 is an optional device within the UPS system 100 that includes utility power outlets with circuit breakers. The enable switch is used to enable and disable the UPS system 100. The battery extension connector allows additional external batteries to be coupled to the UPS system to provide additional backup power, and the access panels allow a technician to access equipment and cabling contained within the chassis 102.

Figure 5:
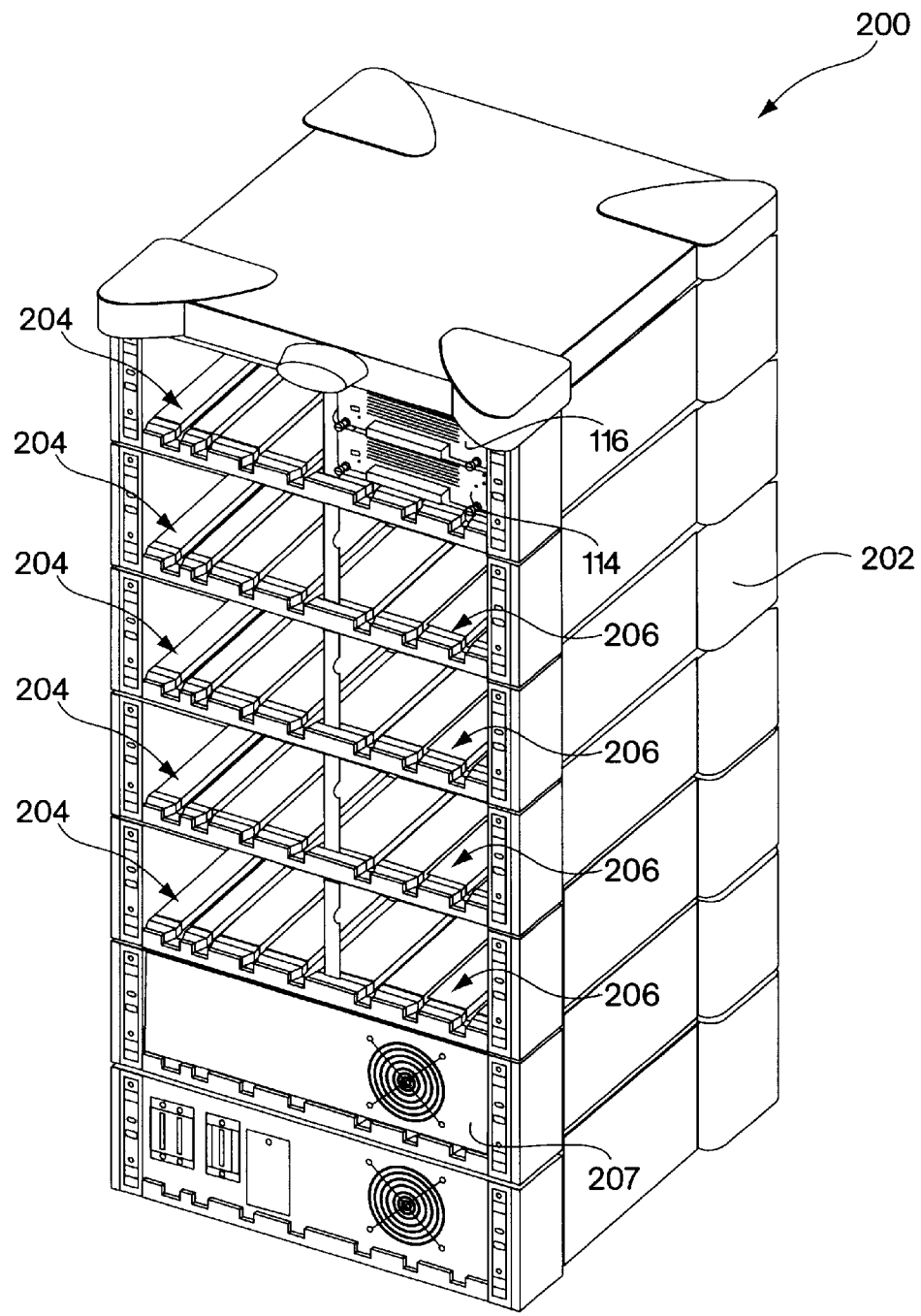
FIG. 5 shows a front perspective view of a UPS system in accordance with another embodiment of the present invention.

FIG. 5 shows a second embodiment of a UPS system 200 in accordance with the present invention. The UPS system 200 includes components mounted within a chassis 202. The UPS system 200 is similar to the UPS system 100 and like components are labeled using the same reference numbers. The UPS system 200 differs from the UPS system 100 in that it has additional bays to accommodate a greater number of power modules 104 and battery modules 106 than the UPS system 100. The output transformer used in the UPS system 200 is larger than that used in the UPS system 100 to accommodate a greater output power capacity. The UPS system 200 has an additional lower bay 207 to accommodate the larger output transformer. The UPS system shown in FIG. 5 has the power modules and battery modules removed, as well as the grill covers. However, depending on load power requirements, up to five power modules may be installed in bays 204, and up to four battery modules may be installed in bays 206 of the UPS system 200. In other embodiments of the invention, UPS systems may have greater than five power modules and four battery modules to provide power to larger loads.

The interconnection and operation of the UPS system 200 will now be further described with reference to a block diagram of the UPS system 200 shown in FIG. 6. The UPS system 100 functions substantially in the same manner as the UPS system 200. AC power from an external AC power source enters the UPS system 200 through the input circuit breaker 108. In some embodiments of the present invention, the input AC power passes through an electromagnetic interference filter and a transient suppression circuit prior to passing through the circuit breaker 108. After passing through the circuit breaker 108, the input AC power is distributed over an input AC power bus 208. The AC power bus 208 provides the input AC power to the power modules 104 and to the bypass switch 110.

Figure 6:
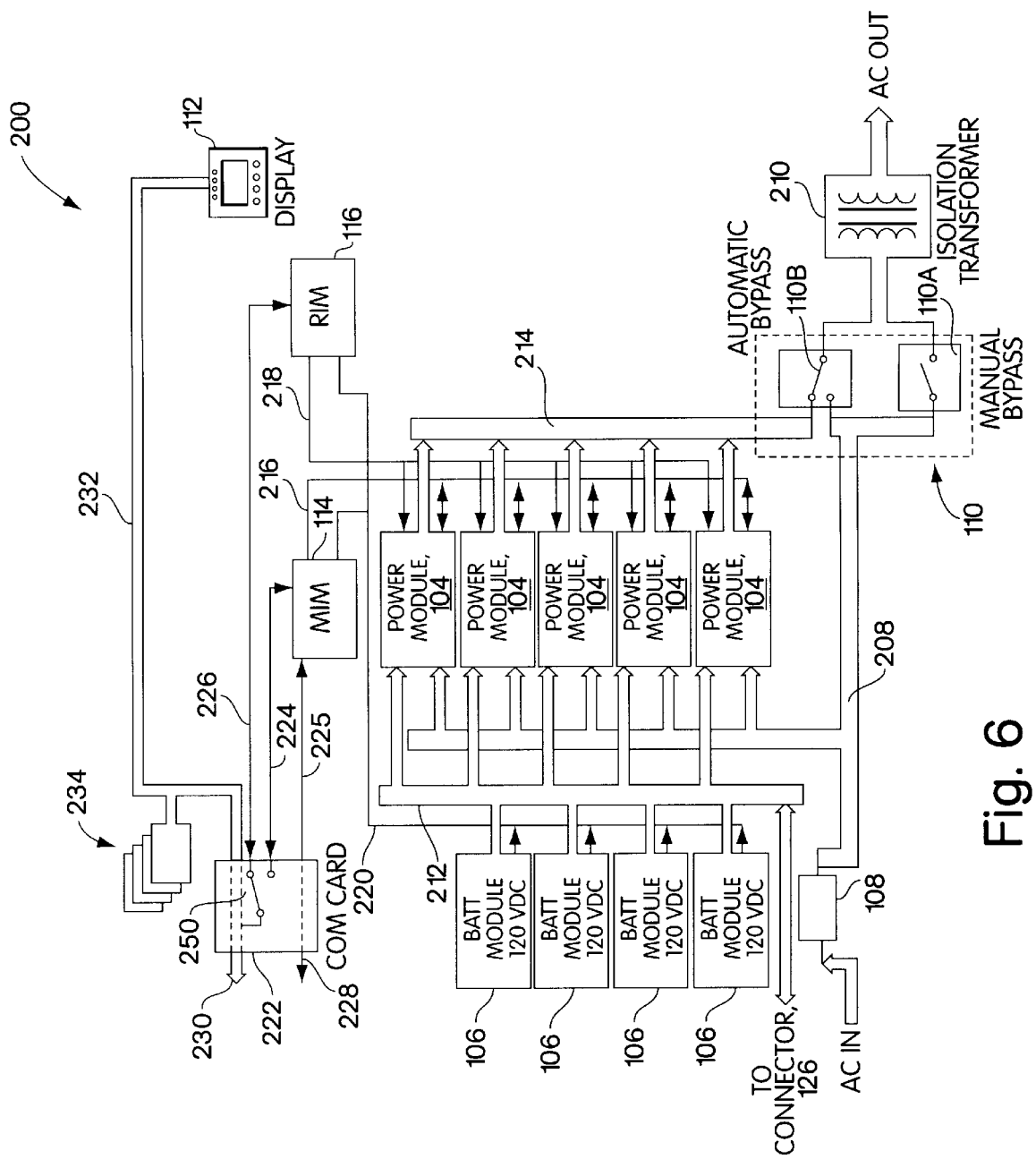
FIG. 6 shows a functional block diagram of the UPS system shown in FIG. 5.

As shown in FIG. 6, the bypass switch 110 contains a manual bypass switch 110A and an automatic bypass switch 110B. The manual bypass switch allows a user, during maintenance of the UPS system 200, to manually bypass the circuitry contained within the UPS system such that the input AC power is provided directly to the output isolation transformer to power a load coupled to the UPS system. The automatic bypass switch is automatically activated by the UPS system if a failure within the UPS system 200, or an increase in load power requirements results in the UPS system being unable to meet the power requirements of the load.

Each of the battery modules 106 is coupled to a DC bus 212 to provide backup DC power to each of the power modules 104. The DC power bus is also coupled to the battery extension connector 126 to allow an external DC power supply to provide DC power to the power modules in addition to that provided by the battery modules. Each of the battery modules is also coupled to the MIM 114 and the RIM 116 through a battery monitor bus 220 to allow the MIM and the RIM to monitor battery status as discussed below.

An output AC power distribution bus 214 is coupled between an output port of each of the power modules 104 and the bypass switch 110 to provide output AC power to the bypass switch to power the load. The isolation transformer 210 receives the output AC power (which is the same as the input AC power if either bypass switch 110A or 110B is activated) from the bypass switch 110 and provides the output AC power to the load.

The MIM 114 is coupled to each of the power modules 104 and to a RIM bus 218 through a MIM bus 216. Similarly, the RIM 116 is coupled to each of the power modules 104 and to the MIM bus 216 through the RIM bus 218. The MIM is also coupled to a communications card 222 through communications lines 224 and 225, and the RIM is coupled to the communications card through a communications line 226. The MIM and RIM also have connections (not shown in FIG. 5) to the other modules to allow monitoring of operational conditions of the UPS system, including characteristics of the input and output power, and to provide phase synchronization, frequency regulation and voltage regulation of the output power as discussed below in greater detail. The MIM functions as the primary controller within the UPS system 200 and the RIM is a redundant controller that can assume control of the UPS system upon failure of the MIM or removal of the MIM from the UPS system.

The communications card 222 includes external connectors 228 and 230 that provide for remote monitoring of the UPS system 200, and communication with external devices such as an external battery controller. The communications card 222 is also coupled to the display module 112 and to up to four communications adapter cards 234 through a communications bus 232. The adapter cards 234 are mounted in the communication card adapter slots 121 (see, FIG. 4).

In one embodiment of the present invention, the interconnections between components of the UPS system 200, shown in FIG. 6, are primarily achieved through the use of backplanes implemented using printed circuit boards. Each of the major components of the UPS system plugs directly into one of the backplaces when mounted in the UPS system. In embodiments of the present invention, the use of backplanes is desired over standard point to point wiring to increase the reliability of the UPS system. Embodiments of the UPS system are designed to provide redundancy for all major components to reduce the number of single point failure mechanisms, however, the backplanes and other components, i.e., relays, switches etc., mounted to the frame of the chassis 202 provide points at which a single failure could cause the entire UPS system to fail. Accordingly, in embodiments of the present invention, to provide high reliability, there are no active components in the frame itself, and all intricate wiring is achieved through the use of printed circuit boards.

The major components within the UPS system 200 will now be described further, beginning with the battery modules 106. In one embodiment of the present invention, each of the battery modules contains ten 12 volt, 7.2 ampere-hour, sealed lead acid batteries connected in series to provide an output voltage of 120 volts. In this embodiment, each of the battery modules is sized to provide six minutes of runtime for a 2.8 kW load. Each of the battery modules contains a sense resistor coupled to a midpoint of the battery module (approximately 60 volts). The value of the resistor identifies the manufacturer of the batteries in the module. The MIM calculates remaining runtime of the load on battery power based in part on the manufacturer of the batteries.

Each of the battery modules includes a thermostat coupled in series with the sense resistor. The thermostat is used to detect the occurrence of a thermal runaway condition by providing a short circuit across the sense resistor when a predetermined temperature threshold is exceeded. The MIM can detect the short circuit and prevent further charging of the battery module that is exhibiting the thermal runaway condition. A precision current sense resistor is provided for each of the battery modules on the backplane to which the battery modules connect to allow the MIM to monitor current from each of the battery modules. The battery modules are hot swappable allowing the modules to be replaced while the UPS system is operating.

Figure 7:
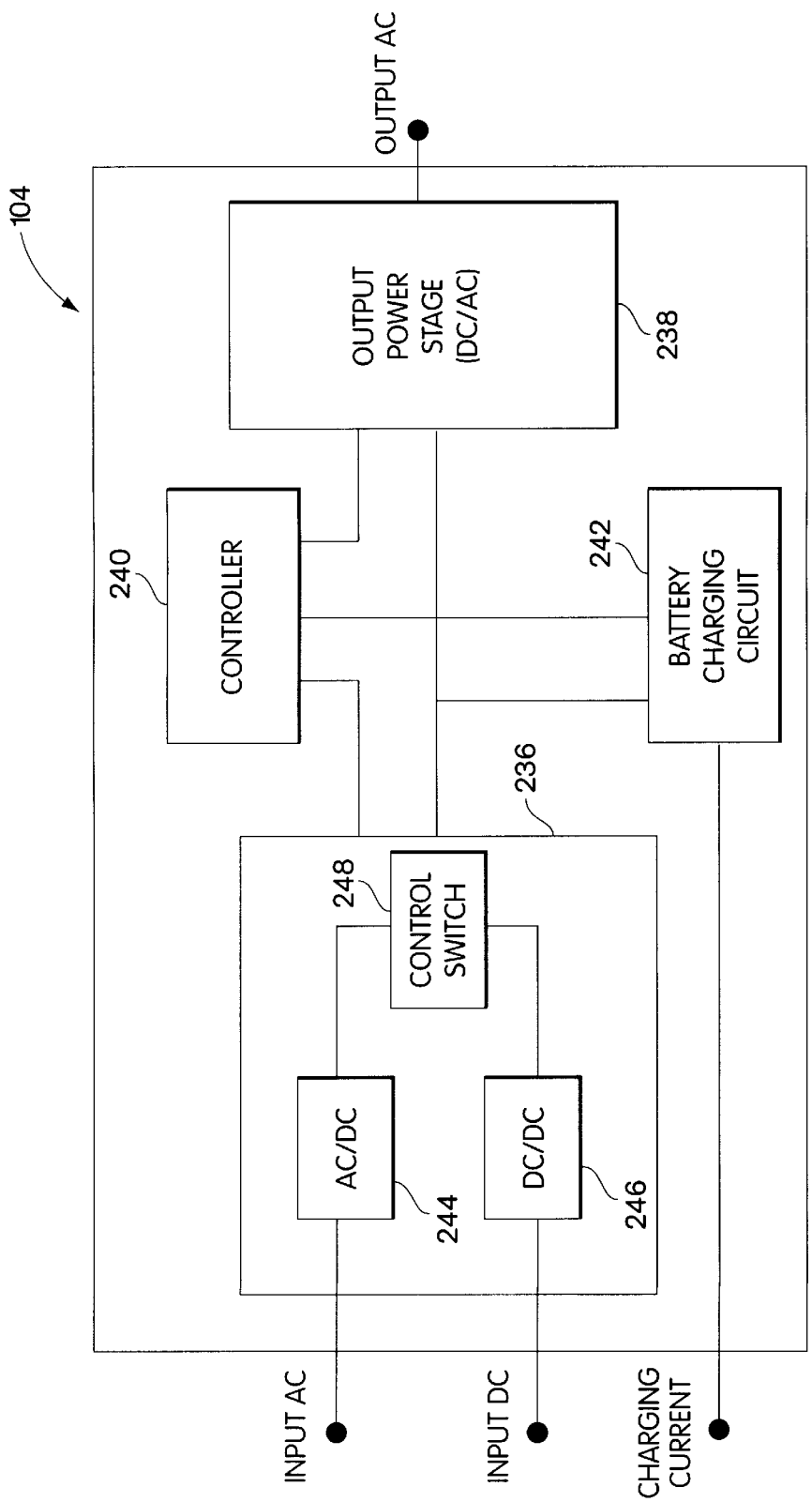
FIG. 7 shows a functional block diagram of a power module used in the UPS system of FIG. 5.

The power modules 104 in one embodiment are substantially identical and each performs the functions of an uninterruptible power supply (without the battery) under the control of the MIM or the RIM. A functional block diagram showing the major functional blocks and interconnections of one of the power modules is shown in FIG. 7. The power module 104 includes an input power stage 236, an output power stage 238, a controller 240 and a battery charging circuit 242. The input power stage 236 includes an AC/DC converter 244, a DC/DC converter 246, and a control switch 248.

The AC/DC converter 244 receives the input AC power and converts the input AC power to DC power. The DC/DC converter 246 receives the DC battery power and modifies the voltage level to produce DC power at substantially the same voltage level as that generated by the AC/DC converter. The control switch 248, under the control of the controller 240, selects either the DC power from the AC/DC converter or the DC power from the DC/DC converter as the input power to the output stage 238. The AC/DC converter also includes circuitry to provide power factor correction. In one embodiment of the present invention, the decision to switch the selected power source from the AC input power to the backup DC power is made individually by each of the power modules. This provides additional redundancy by using decentralized control points in place of one central control point. In this embodiment, the MIM can force a switch of the selected power for test purposes. In other embodiments, the decision to switch the selected power source may be coordinated for all of the power modules by the MIM or the RIM.

The output power stage 238 generates the output AC power from the DC power received from the input power stage. The battery charger circuit 242 generates charge current using the DC power from the AC/DC converter to charge the battery modules 106. The controller 240 controls operation of the input power stage, the output power stage and the battery charging circuit. In addition, the controller 240 provides the primary interface in the power module to the MIM 114 and the RIM 116.

In one embodiment of the present invention, each power module is designed to provide a maximum of 4 kVA to a load, and the output voltage level is selectable from the following values 208 V, 220 V, 230 V, and 240 V under the control of the MIM or RIM. In this embodiment, the power module is designed to receive an input AC voltage (at full load) over the range 155 V to 276 V, and an input DC voltage of 120 V from the battery modules. The input power stage generates regulated DC output voltages of ±385 V. The battery charger circuit in each power module generates 3 A of charging current at either 137 V or 147 V under the control of the MIM or RIM.

The communications card 222 provides the interface between the communication line 224 of the MIM or the communication line 226 of the RIM and a number of components including an external monitoring device, accessory cards 234, and the display module 112. As shown in FIG. 6, the communications card includes a switch 250 that selectively couples either the communication line 224 of the MIM or the communication line 226 of the RIM to the components coupled to the communications card. The communications card also provides the interface between the communications line 225 of the MIM and an external device coupled to output connector 228. In one embodiment of the present invention, the external device may be a battery controller used to control and monitor external batteries that provide additional DC power to the UPS system 200 through connector 126.

In one embodiment of the present invention, the accessory cards can be implemented using SmartSlot™ cards available from American Power Conversion Corporation, of West Kingston, R.I., the assignee of the present invention.

The display module 112 provides the primary user interface to the UPS system 200. As discussed above, the display module communicates through the communications card to either the MIM or RIM depending on which of the two is controlling the UPS system. In one embodiment, the display module includes a 4×20 alphanumeric LCD screen with four navigation keys, four LED status indicators and an audible alarm beeper. The alphanumeric LCD screen displays system status, fault reports and module diagnostics information.

Figure 8:
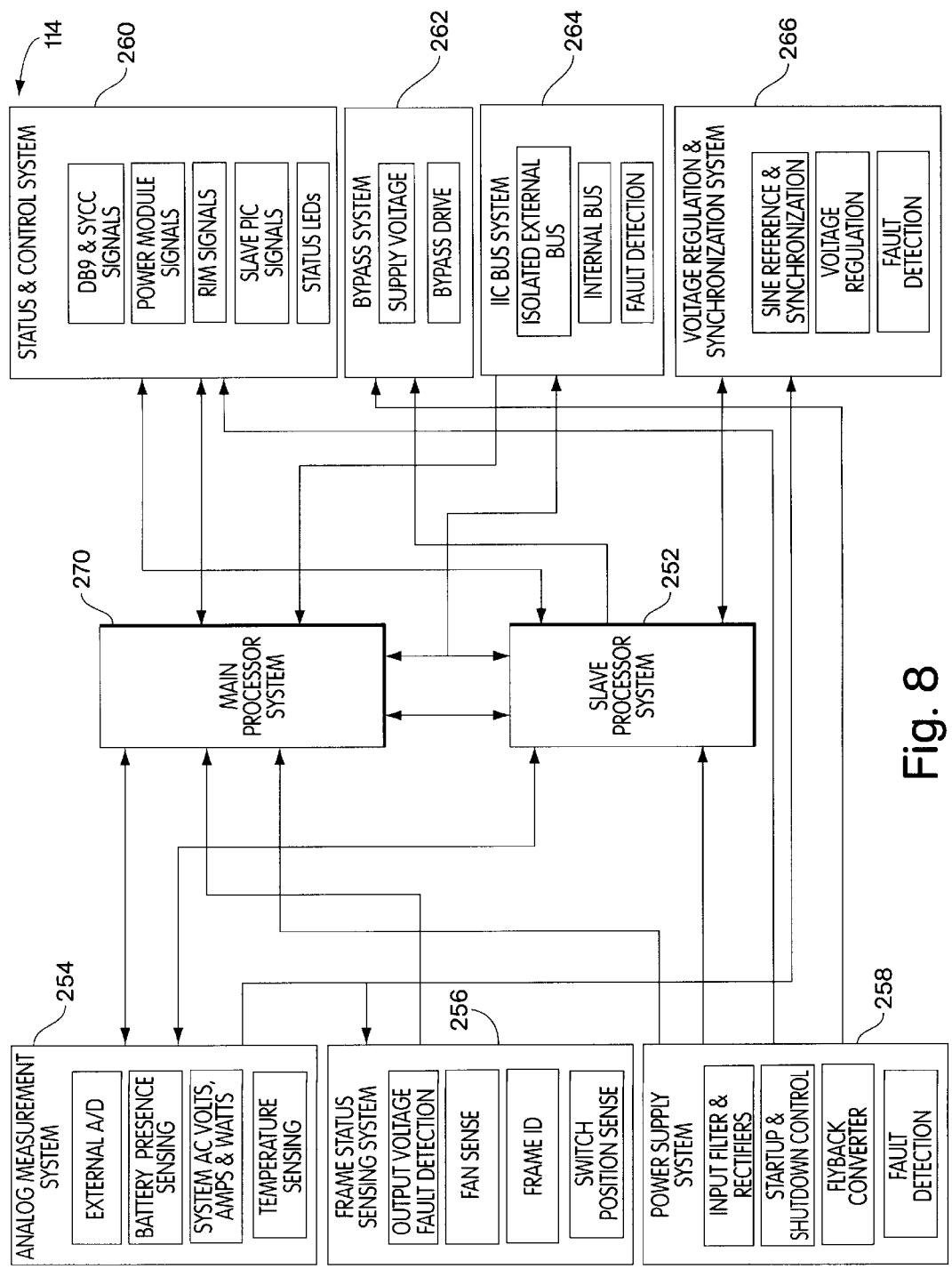
FIG. 8 shows a functional block diagram of a main intelligence module used in the UPS system of FIG. 5.

The main intelligence module (MIM) 114 is the primary computer/controller in the UPS system 100, and acts as the central point in the system for collecting and communicating information about aspects of the power modules 104, battery modules 106, the redundant intelligence module (RIM) 116, components contained within the housing of the UPS system, and characteristics of the AC input power and AC output power of the UPS system. A block diagram of the MIM is shown in FIG. 8. The MIM includes a main processor system 270, a slave processor system 252, an analog measurement system 254, a frame status monitoring system 256, a power supply system 258, a status and control system 260, a bypass system 262, an inter-integrated circuit (IIC) bus system 264, and a voltage regulation and synchronization system 266.

The main processor system 270 functions as the primary controller for the MIM, and is coupled, either directly or indirectly, to each of the other major systems of the MIM shown in FIG. 8. The main processor system provides primary control of the slave processor system in the MIM and the redundant processor in the RIM. The main processor provides control, monitoring and status reporting of non-critical functions of the UPS system, including monitoring functions of the frame components and reporting status through the communications card to the display module 112 and to any external devices coupled to the communications card. The more critical functions within the UPS system are controlled and monitored by the slave processor in the MIM (or the redundant processor in the RIM upon failure of the MIM). The main processor system also acts as the bus master for an internal IIC serial data bus coupled between the power modules, the RIM and the MIM and in one embodiment as the bus master for an external IIC bus that is used as the communications line 225 between the MIM and the communications card. As the bus master of the internal IIC bus, the main processor system is the only device that can initiate a serial communication with any other device coupled to the bus. In one embodiment of the present invention, the main processor system is implemented using a Phillips 80C552 microcontroller with 32 Kbytes of external RAM, 120 Kbytes of external ROM and an external 1 Kbytes EEPROM.

The slave processor system 252 is coupled directly or indirectly to each of the other systems within the MIM and provides control and monitoring of critical functions of the UPS system, including: regulation of output voltage, frequency and phase; monitoring of input voltage, input frequency and battery voltage; bypass control; and state control of the UPS system (state control is described in further detail below). In one embodiment, the slave processor system 252 is implemented using a Microchip PIC 16C77 microcontroller.

The analog measurement system 254 provides the interface in the MIM to the battery modules to sense the presence of battery modules and to measure the output DC voltage and output current of each of the modules. The analog measurement system includes an external analog to digital converter that converts analog measured values to digital values for processing in the main processor system and to the slave processor system. The A/D converter provides 12 bit precision measurement from each battery module, battery voltage, and output power The analog measurement system is coupled to the input and output AC power lines to measure characteristics of the input and output power, including input voltage, input frequency, output voltage, output frequency, output power, and output current. The analog measurement system also includes a temperature detection circuit that detects and monitors the internal temperature of the MIM. The analog measurement system is coupled to the frame status sensing system and the voltage regulation and synchronization system to provide each of these systems with the output AC voltage. In addition, the analog measurement system includes an external A/D converter that allows for 12 bit precision measurement of current from each battery module, battery voltage, and output power.

The frame status sensing system 256 provides the interface in the MIM to components in the frame. The frame status sensing system is coupled to fans in the frame to monitor operation of the fans, and the frame status sensing system is coupled to a jumper array in the frame to detect a frame configuration identification value for the UPS system. The frame configuration identification value indicates a generic model number of the frame. The frame status sensing system is also coupled to the bypass switch and the circuit breaker to monitor/sense the position of switches in these devices. In addition, the frame status sensing system is coupled to the output voltage lines to provide output voltage fault detection.

The power supply system 258 of the MIM is the primary power supply of the MIM and generates low voltage DC power for use in the MIM using either the input AC power, or upon any failure of the input AC power, the DC battery power. The power supply system includes input filters and rectifiers and a flyback converter for generating the low voltage DC power. The power supply system also includes startup and shutdown control circuitry and fault detection circuitry.

The status and control system 260 of the MIM provides the primary interface for the MIM to the communications card, the power modules, and the RIM. In addition, the status and control system controls the status of LEDs located on the front panel of the MIM.

The bypass system 262 provides the interface for the MIM to the bypass switch. The bypass system receives a DC supply voltage from the power supply system 258, and under the control of the slave processor system controls the automatic bypass switch using the DC supply voltage when requested by a user or when needed due to an overload condition or dropout of the output AC voltage.

The IIC bus system 264 provides the interface between the MIM and the internal IIC bus and the external IIC bus. In one embodiment, both the internal IIC bus and the external IIC bus are implemented using an industry standard 2 wire serial bus developed by Phillips Semiconductor. The internal and external IIC buses provide bidirectional data transfer to allow communication between the MIM and the power modules, between the MIM and the RIM, and between the MIM and external devices through port 228 of the communications card. In one embodiment, the RIM and each of the power modules has a unique address on the internal bus allowing the MIM to query each of these at regular intervals. In one embodiment, the internal IIC bus as well as other control lines are contained in the MIM bus 216 (shown in FIG. 7).

The voltage regulation and synchronization system 266 is responsible for regulating the magnitude, frequency and phase of the AC power produced by the power modules under the control of the slave processor system. User settings for frequency and voltage tolerances may be input to the MIM through the display module, and the voltage regulation and synchronization system maintains the output frequency and voltage to be within the specified tolerances. The voltage regulation and synchronization system receives the input AC voltage from the circuit breaker, and receives the output AC voltage from the analog measurement system. Based on these AC voltages, the voltage regulation and synchronization system generates analog signals over control lines contained in bus 216 to regulate the output voltage and synchronize the phase of the output voltage with the phase of the input voltage signal. In the absence of an input AC voltage, or in the event that the frequency of the input AC voltage is not within present tolerances, then the MIM allows the frequency of the output voltage signal to be free-running, not synchronized to the input or to the output. In one embodiment, for a nominal input frequency of 60 Hz, the preset tolerance is 57–63 Hz, and for an nominal input frequency of either 50 Hz or 60 Hz, the preset tolerance is 47–63 Hz. If the MIM is not in control (as explained below), the synchronization source for the MIM is set to the output voltage signal to allow the MIM to track the phase of the output voltage signal.

Figure 9:
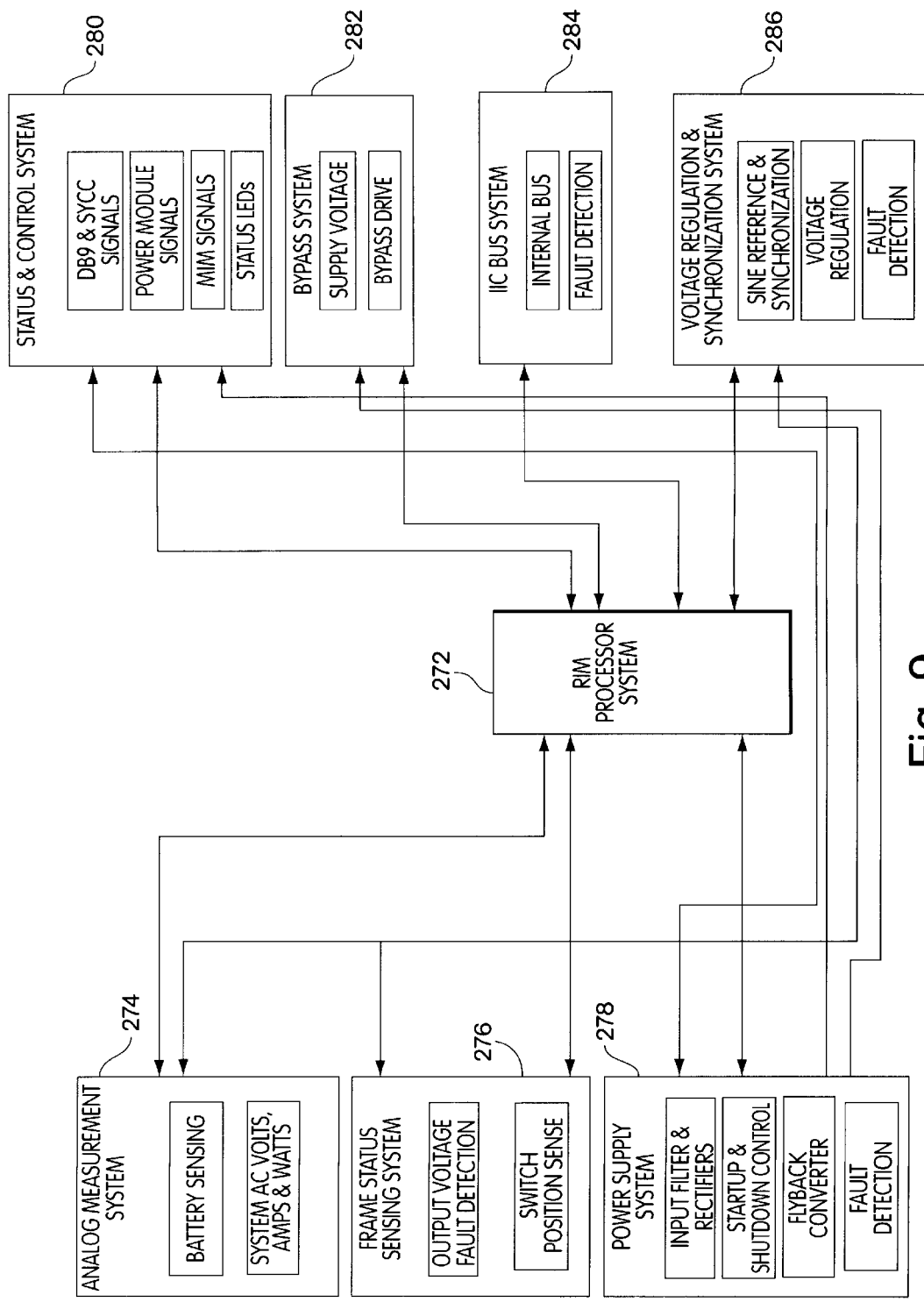
FIG. 9 shows a functional block diagram of a redundant intelligence module used in the UPS system of FIG. 5.

The redundant intelligence module (RIM) 116 is a backup version of the MIM, and provides redundancy in the event of a MIM failure, or while a MIM is being replaced. If a functioning MIM is present, the RIM can be removed without a loss of functionality in the UPS system. A block diagram of the RIM 116 is shown in FIG. 9. The RIM includes a redundant processor system 272, an analog measurement system 274, a frame status monitoring system 276, a power supply system 278, a status and control system 280, a bypass system 282, a IIC bus system 284, and a voltage regulation and synchronization system 286. In one embodiment, the RIM includes the same major systems as the MIM except for the main processor system. However, as described below in greater detail, and shown in FIG. 9, some of the systems in the RIM have less functionality than the corresponding systems in the MIM.

The redundant processor system 272 is coupled directly or indirectly to each of the other systems within the RIM, and similar to the slave processor system in the MIM, the redundant processor system provides control and monitoring of critical functions of the UPS system, including regulation of output voltage, frequency and phase, monitoring of input voltage, input frequency and battery voltage, bypass control, and state control of the UPS system. In one embodiment, the redundant processor system 272 is implemented using a Microchip PIC 16C77, such that the redundant processor system is substantially identical to the slave processor subsystem of the MIM.

The analog measurement system 274 of the RIM acts as the interface for the RIM to the battery modules and to the input and output power buses in a manner similar to the analog measurement system 254 of the MIM. However, the analog measurement system 274 measures and monitors only a subset of the parameters measured and monitored by the analog measurement system of the MIM. Specifically, the analog measurement system 274 measures input voltage, input frequency, output voltage, output frequency and battery voltage. The analog measurement system 274 provides the redundant processor system 272 with the values measured.

The frame status sensing system in the RIM 276 monitors the position sense of the automatic bypass switch and the maintenance switch and reports these to the redundant processor system for state control purposes.

The power supply system 278 of the RIM is substantially identical to the power supply system 258 of the MIM.

The status control system of the RIM provides the primary interface for the RIM to the communications card, the power modules, and the MIM. In addition, the status and control system controls the status of LEDs located on the front panel of the RIM. Unlike the MIM, the RIM does not monitor individual power module status. However, like the MIM, the RIM through the status and control system can control the power modules to connect or disconnect them from the output AC power bus. In embodiments of the present invention, both the MIM and the RIM can provide controlled shut down of power modules based on commands received from users, commands received from intelligent loads through the communications card, or when the battery voltage drops below a predetermined threshold. The status control system also allows the RIM to monitor status of the MIM through a number of hardware control lines (discussed in detail further below) so that the RIM can mirror critical state signals to allow the RIM to assume control of the UPS upon failure or removal of the MIM.

The bypass system 282 of the RIM is substantially identical to that of the MIM except that the bypass system of the RIM is only used when the RIM has assumed control of the UPS system due to failure or removal of the MIM.

The IIC bus system 284 of the RIM acts as the interface between the RIM processor and the internal IIC bus. As discussed above, the MIM acts as the bus master and is the only device that can initiate communication over the internal IIC bus. In embodiments of the present invention, even upon failure of the MIM, the RIM cannot communicate with the power modules over the IIC bus.

The voltage regulation and synchronization system 286 in the RIM is substantially identical to that of the MIM. Upon failure of the MIM, the voltage regulation and synchronization system of the RIM is responsible for regulating the magnitude, frequency and phase of the voltage produced by the power modules.

A significant benefit of embodiments of UPS systems in accordance with the present invention is the fault tolerance provided by the use of redundant control systems. This redundancy significantly reduces the possibility of a failure of the UPS system, and accordingly reduces the possibility of either a reduction in input power to a critical load or a reduction in power redundancy provided to the load. In addition, the redundancy provided in UPS systems in accordance with the present invention, allows hotswapping, whereby a failed or malfunctioning MIM or RIM can be removed while the UPS system is operating. As will now be discussed below, to implement the redundancy and hotswapping features, the MIM and RIM in embodiments of the present invention contain systems to provide fault detection, transfer of output power regulation control and transfer of system state control.

In embodiments of the present invention, to ensure proper transfer of control from the MIM to the RIM, the MIM contains extensive fault detection circuitry to allow early detection of any faults within the MIM, so that transfer of control from the MIM to the RIM can occur quickly to prevent any downtime of the UPS system. As shown in FIG. 7 each of the following systems in the MIM contains fault detection circuitry: the power supply system, the IIC bus system and the voltage regulation and synchronization system. In addition, the main processor system and the slave processor system are programmed to detect faults contained therein. Upon detection of any faults within the MIM that are preventing the MIM, or in the future may prevent the MIM, from asserting control over the power modules to regulate the output power, a transfer of control from the MIM to the RIM is initiated. In one embodiment, these faults include: faults associated with the internal or external memory or EEPROM of the main processor system; faults associated with the external A/D converter in the analog measurement system of the MIM, which indicate possible problems with DC voltages supplied to the main processor system and the slave processor system; and faults associated with operation of the slave processor system or communication between the slave processor system and the main processor system. When one of these faults occurs, indication of the fault is provided to the user by the power display module. In addition to the faults discussed above, in one embodiment, control will pass from the MIM to the RIM, if the RIM indicates to the MIM that it is taking control. The RIM will take control if it does not receive indication from the MIM that the MIM is operating correctly, possible indicating a fault in the MIM's status circuitry.

The MIM can also detect less critical faults that are reported to the user through the power display module. However, the occurrence of these less critical faults does not transfer control from the MIM to the RIM. In one embodiment, these less critical faults include: communication failure between the MIM and the power modules or the MIM and the communications card; and detection of failures of devices external to the MIM. In general, the MIM will maintain control so long as a detected fault does not result in the MIM having less functionality than that provided by a fully operational RIM. As discussed above, in one embodiment, the functionality of a fully operational MIM is greater than that of the RIM.

A user can initiate a transfer of control from the MIM to the RIM by removing the MIM from the UPS system. In one embodiment of the present invention, both the MIM and the RIM have microswitches that are enabled upon insertion of the MIM or the RIM in the UPS system. In this embodiment, transfer from the MIM to the RIM will occur by disabling the microswitch without actually removing the MIM from the UPS system.

The RIM also contains extensive fault detection circuitry. If the RIM detects either that it has faulty IIC bus circuitry or that it has faulty regulation circuitry (such that it could not provide regulation and phase synchronization for the output power), it illuminates an LED on its front panel, and it notifies the MIM that it cannot take control of the UPS system. The MIM will provide notification to the user through the power display of the failure of the RIM.

In embodiments of the present invention, it is desirable to transfer output power regulation control from the MIM to the RIM, or from the RIM to the MIM quickly (typically in less than 1 millisecond) to prevent any disruption in output power that could adversely affect loads powered by the UPS system. To accomplish this, the power modules have control inputs coupled to the MIM and to the RIM to receive control signals indicating whether the MIM and/or the RIM can provide regulation of the output power. These are LO active signals. If the control signal from the MIM is good (i.e., LO), the power modules will be regulated by the MIM, regardless of the status of the control signal from the RIM. If the control signal from the MIM is bad and the control signal from the RIM is good, the power modules will be regulated by the RIM. If both the control signal from the MIM and the control signal from the RIM is bad, regulation of the power modules defaults to the MIM. In embodiments of the present invention, the de-assertion of these control signals from the MIM and the RIM occurs using both hardware and software to ensure that the deassertion of the signals occurs quickly.

In addition to transferring output power regulation control between the MIM and the RIM when a failure occurs, UPS systems in accordance with the present invention also provide for the following when transferring control between the MIM and the RIM: control of the switch 250 in the communications card 222; maintaining critical state control values (including power module ON/OFF control and control of the bypass switch) at present values; preventing control from being transferred to a "bad" device; preventing repeated transfers; and operating through a loss of power to the MIM or the RIM.

Figure 10:
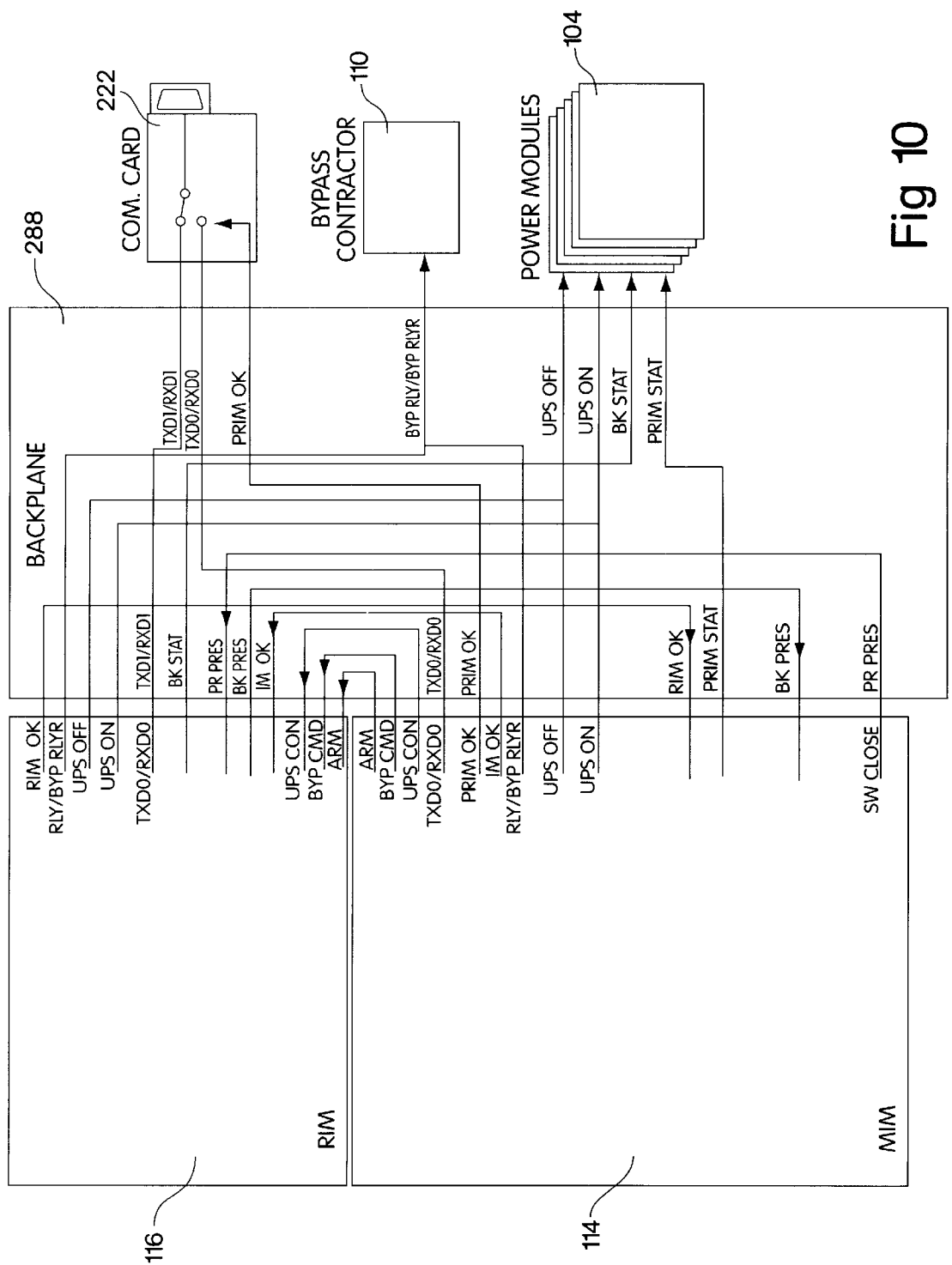
FIG. 10 is an illustration of the interconnection signals between critical components in the UPS system of FIG. 5.

The procedure by which UPS systems in accordance with embodiments of the present invention accomplish the functions described in the preceding paragraph will be further described below with reference to FIGS. 10–14. FIG. 10 is a block diagram showing control lines and signal lines between the MIM 114, the RIM 116, the communications card 222, the bypass contactor 110 and the power modules 104 through the backplane 288. Each of these control lines and signal lines is discussed below.

PRIM_OK is a signal from the MIM to the communications card. The deassertion of PRIM_OK controls the switch 250 in the communications card 222 to switch from the MIM communications line to the RIM communications line. The signal PRIM_OK is generated by the main processor in the MIM.

IM_OK is a signal from the main processor in the MIM to the redundant processor in the RIM. The assertion of signal IM_OK indicates to the RIM that the MIM is functioning properly and that the MIM should maintain control. The deassertion of this signal indicates that the MIM is not functioning properly and that the RIM should assume control. Signals IM_OK and PRIM OK are generated by the same signal in the main processor, so that upon failure of the MIM, the RIM is signaled to take control, and the communications card selects the RIM as the source of data through the card.

PRIM_STAT is a signal from the MIM to the power modules and controls whether the output voltage from the power modules is regulated by the MIM. This signal is gated by the IM OK signal, and is always "true" if a RIM is not present to prevent transfer to a non-existent RIM. If a RIM is present, and the IM_OK signal indicates a failure of the MIM this signal will change from the "true" state to a "false" state to cause the power modules to select the RIM as the source of regulation control (so long as BK_STAT indicates the RIM is able to do so).

BK_STAT is a signal from the RIM to the power modules indicating that the RIM is capable of regulating the output voltage. The assertion of this signal does not cause the power modules to be regulated by the RIM. The power modules contain circuitry requiring them to respond to the MIM for regulation if the MIM is able to do so (if PRIM_STAT is asserted).

PR_PRES is a signal from the MIM to the RIM and indicates that the MIM is present, but not necessarily on or running. In one embodiment, this signal is generated when the microswitch in the MIM is enabled upon insertion of the MIM into the UPS system chassis.

RIM_OK is a signal from the RIM to the MIM indicating that the RIM is capable of regulating the output voltages of the power modules.

BK_PRES is a signal from the RIM to the MIM and indicates that the RIM is present, but not necessarily on or running. In one embodiment, this signal is generated when the microswitch in the RIM is enabled upon insertion of the RIM into the UPS system chassis.

UPS_CON is a signal from the main processor in the MIM to the redundant processor in the RIM indicating to which state the UPS ON/OFF signals to the power modules should be set. A "low" value indicates that the power modules should connect to the output power bus. This signal is also sent from the main processor to the slave processor in the MIM to coordinate the state between the redundant processor and the slave processor. This signal will be ignored by the redundant processor and the slave processor unless the signal ARM is asserted.

BYP_CMD is a signal from the main processor in the MIM to the redundant processor in the RIM indicating to which state the BYP_RLY signal to the bypass contactor should be set. A "high" value indicates that the bypass contactor should be in the "IN" state such that the UPS system is essentially bypassed. This signal is also sent from the main processor to the slave processor in the MIM to coordinate the state between the redundant processor and the slave processor. This signal will be ignored by the redundant processor and the slave processor unless the signal ARM is asserted.

ARM is a signal from the main processor in the MIM to the redundant processor in the RIM (and also to the slave processor in the MIM) that acts as a fail safe to ensure that a single fault in the BYP_CMD or UPS_CON signals does not result in the bypass contactor being activated or the power modules being shut off. As stated above, the slave processor and the redundant processor will ignore the BYP_CMD and UPS_CON signals unless the ARM signal is activated.

UPS_ON and UPS_OFF are control signals from the MIM to the power modules and from the RIM to the power modules that control the power modules to either connect to or disconnect from the output power bus. The control lines for these signals are tied in parallel to both the MIM and the RIM, and either the MIM or the RIM (whichever is not in control at that time) will set the output for these signals to a benign (deasserted) state to allow the other to control the power modules. The power modules will not respond to UPS_ON and UPS_OFF unless they are of opposite polarity.

BYP_RLY is a signal from both the MIM and the RIM to the bypass contactor to control the state of the bypass contactor. The control lines for this signal are tied in parallel to both the MIM and the RIM. Either the MIM or the RIM (whichever is not in control at that time) will set the output for this signal to a benign (deasserted) state to allow the other to control the bypass contactor.

TXD0/RXD0 and TXD1/RXD1 are data signals from the MIM and RIM respectively to the communications card.

FIGS. 11 and 12 show logical truth tables for the control state of respectively the slave processor in the MIM and the redundant processor in the RIM for a number of conditions. For those conditions resulting in an outcome of "Yes" for the truth table in FIG. 11, the slave processor in the MIM is providing regulation of the output of the power modules. For those conditions resulting in an outcome of "Yes" for the truth table in FIG. 12, the redundant processor in the RIM is providing regulation of the output of the power modules.

As shown in FIG. 11, the slave processor is in control for all conditions, except when the RIM is "Ok" and either the main processor or the slave processor, or both, have failed. The slave processor monitors the status of the redundant processor based on the state of the RIM_OK signal from the RIM to the MIM. The slave processor is "Ok", if the PRIM_STAT signal is asserted, and the main processor is "Ok", if the IM_OK signal has been asserted. As shown in the truth table of FIG. 11, the MIM is in control even if the main processor and slave processor are not "Ok", if the RIM is also not "Ok". If the MIM is not in control, the voltage regulation and synchronization control system in the MIM uses the output voltage signal as the synchronization source, and outputs UPS_ON, UPS_OFF and BYP_RLY from the MIM are set to the benign state.

As shown in FIG. 12, the RIM is only in control when the RIM is "Ok" and the MIM has failed. The RIM uses the IM_OK signal to determine the status of the MIM. The RIM is "Ok" if the BK_STAT line is asserted. If the RIM is not in control, the voltage regulation and synchronization control system in the RIM uses the output voltage signal as the synchronization source, and outputs UPS_ON, UPS_OFF and BYP_RLY from the RIM are set to the benign state.

When the RIM is in control, the MIM will take control back from the RIM if it is able to do so. In one embodiment of the present invention, to prevent repeated transfers between the MIM and the RIM, which may occur, for example, if the MIM has an intermittent failure, after three successive transfers in a 2 minute period of time, the MIM will transfer control to the RIM until either the MIM is replaced, or power is cycled to the MIM.

Figure 13:
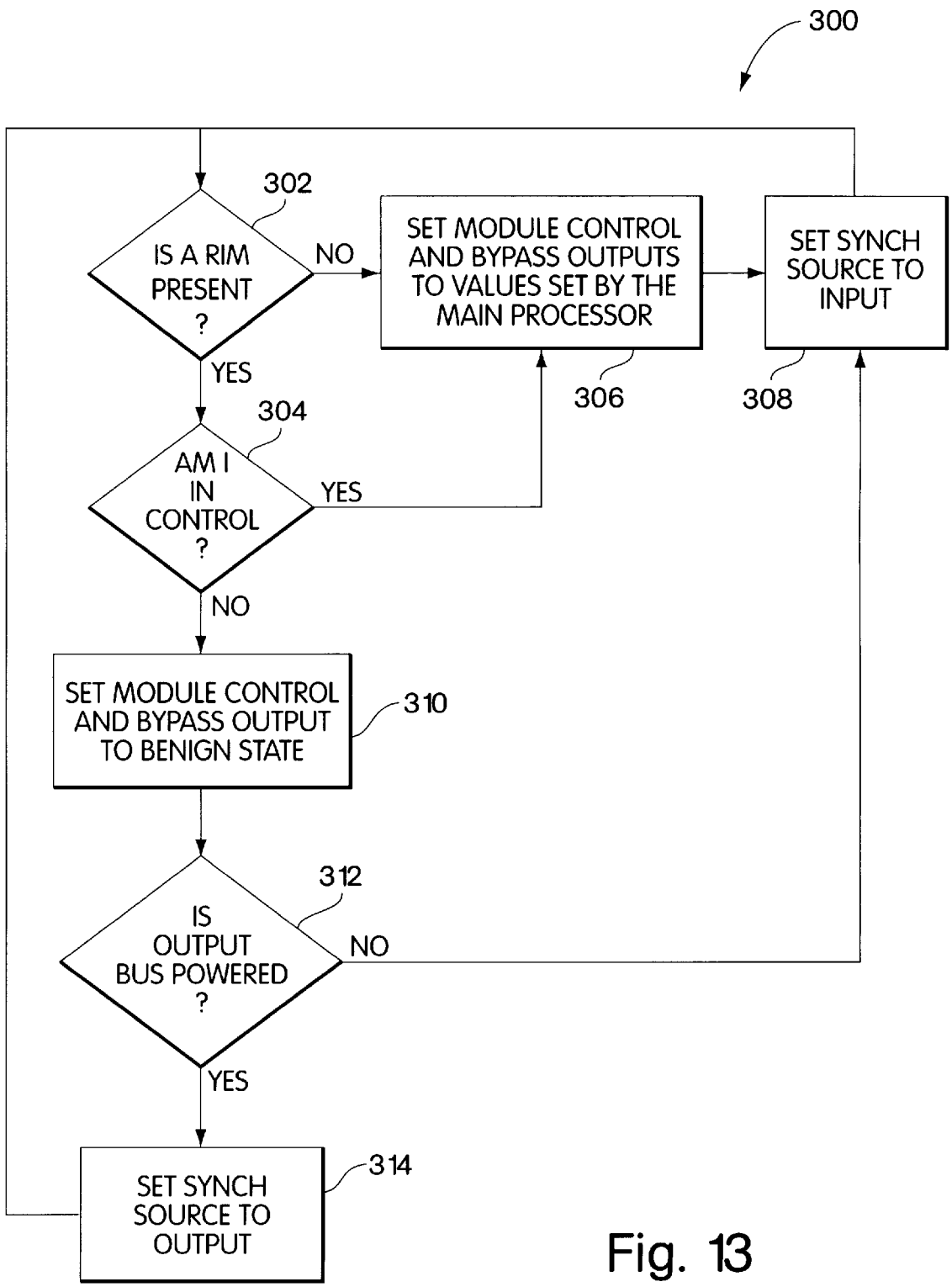
FIG. 13 is a flow chart of a control process implemented in the main intelligence module shown in FIG. 8.
Figure 14:
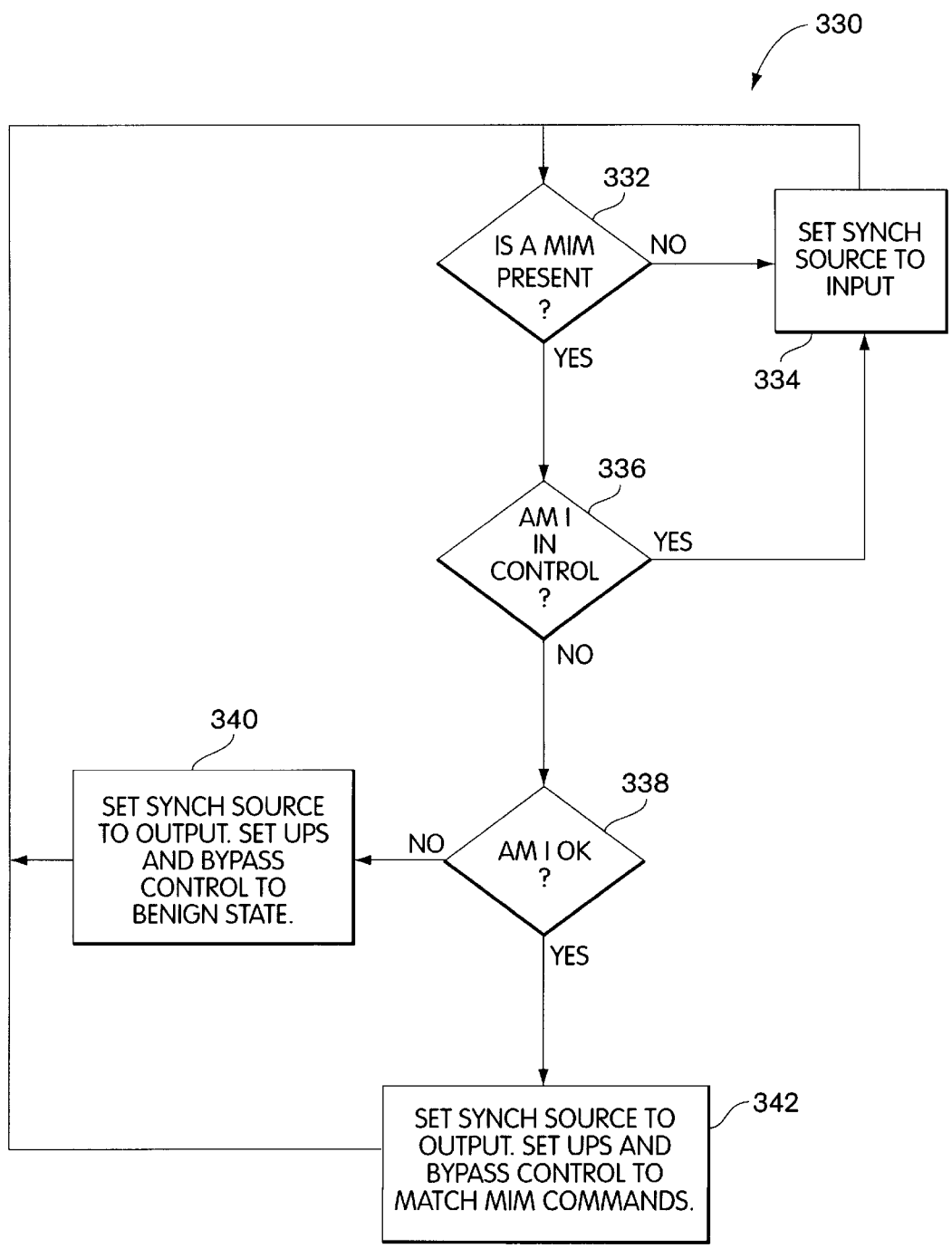
FIG. 14 is a flow chart of a control process implemented in the redundant intelligence module shown in FIG. 9.

FIG. 13 is a flow chart of the control process 300 used by the slave processor in the MIM, and FIG. 14 is a flow chart of the control process 330 used by the redundant processor in the RIM. In an initial step 302 of the control process 300, the slave processor determines if a RIM is present in the UPS system by checking the status of the BK_PRES signal from the RIM. If a RIM is not present, the process proceeds to step 306, wherein the control signals UPS_ON, UPS OFF and BYP_RLY are set to the states indicated by control signals UPS_CON and BYP_CMD from the main processor. Next, in step 308, the slave processor sets the synchronization source to the input voltage signal. The process then returns to step 302.

If the slave processor determines in step 302 that a RIM is present, then in step 304, a determination is made as to whether the slave processor is in control using the logic shown in the truth table of FIG. 11. If the outcome of step 304 is "Yes", then the process continues with steps 306 and 308 in the same manner as described above. If the outcome of step 304 is "No", then the process continues with step 310 wherein the control signals UPS_ON, UPS_OFF and BYP_RLY are set to the benign state. A determination is then made in step 312 as to whether the output AC power distribution bus is powered. If the outcome of step 312 is "No", then the synchronization source for the MIM is set to the input voltage signal. If the outcome of step 312 is "Yes", then in step 314, the synchronization source is set to the output voltage signal. The process then returns to step 302. If the outcome of step 312 is "No", then the synchronization source for the MIM is set to the input voltage wave form in step 308, and the process returns to step 302.

The control process 330 used by the redundant processor in the RIM will now be described. In an initial step 332 of the control process 330, the redundant processor determines if a MIM is present in the UPS system by checking the status of the PR_PRES signal from the MIM. If a MIM is not present, the process proceeds to step 334, wherein the redundant processor sets the synchronization source of the RIM to the input voltage signal. The process then returns to step 332.

If the outcome of step 332 is "Yes", then in step 336, the redundant processor determines if it is in control using the logic shown in the truth table of FIG. 12. If the outcome of step 336 is "Yes", then the process continues with step 334, described above. If the outcome of step 336 is "No", then in step 338, the redundant processor determines if the RIM is operating properly. If the outcome of step 338 is "No", then in step 340, the synchronization source of the RIM is set to the output voltage signal, and the control signals UPS_ON, UPS_OFF and BYP_RLY are set to the benign state. The process then returns to step 332.

If the outcome of step 338 is "Yes", then the process continues to step 340, wherein the synchronization source for the RIM is set to the output voltage signal, and the control signals UPS_ON, UPS_OFF and BYP_RLY are set to match the states commanded by the MIM. The process then returns to step 332.

In embodiments of the invention described above, the MIM has greater functionality than the RIM allowing the RIM to be a lower cost module. In other embodiments of the present invention, the MIM and the RIM may be substantially identical, allowing the RIM to perform all of the functions of the MIM upon failure of the MIM or if the MIM is removed from the UPS system chassis. In addition, in the embodiments described above, the MIM and the RIM are contained in separate removable modules. This is advantageous in that it allows one of them to be removed and replaced while the other remains in control of the UPS system. However, in other embodiments, the MIM and the RIM may be contained within the same module.

In embodiments of the invention, voltage regulation is provided by the MIM or the RIM. As understood by one skilled in the art, in other embodiments, regulation could be provided by each of the power modules.

UPS systems in accordance with embodiments of the present invention described above include a redundant control system, multiple power modules and multiple battery modules. Embodiments of the present invention are not limited to UPS systems having multiple power modules and battery modules, but also include UPS systems having only one battery module and/or only one power module.

In embodiments of the patent invention described above, power supply systems include a controller and a redundant controller. In other embodiments, a power supply system may include additional controllers to provide further redundancy

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only. It is not intended as limiting. The invention's limit is defined only in the following claims and the equivalence thereto.

What is claimed is:

1. A power supply system comprising:
   a power input to receive input power from a power source;
   a power output to provide power to a load;
   at least one battery;
   a first power module coupled to the power input, the power output and the battery to provide power to the load;
   a second power module coupled to the power input, the power output and the battery to provide power to the load;
   a first controller electrically coupled to the first power module; and
   a second controller electrically coupled to the second power module and the first controller;
   wherein one of the first controller and the second controller functions as a primary controller to regulate the power to the load.

2. The power supply system of claim 1, wherein the second controller is configured as a redundant controller and provides regulation of the power to the load upon failure of the first controller.

3. The power supply system of claim 2, further comprising a display module, coupled to the first controller and the second controller, the display module being adapted to display status information to a user of the power supply system.

4. The power supply system of claim 3, wherein the first controller functions as a primary display controller and provides the status information to the display module, and the second controller functions as a redundant display controller and provides status information to the display module upon failure of the first controller.

5. The power supply system of claim 4, further comprising a communications port, coupled to the first controller and the second controller, for providing communications between the power supply system and external devices.

6. The power supply system of claim 5, wherein the first controller functions as a primary communications controller that monitors and controls communications through the communications port, and the second controller functions as a redundant communications controller that monitors and controls communications through the communications port upon failure of the first controller.

7. The power supply system of claim 6, further comprising a frame having a first opening to receive the first power module and a second opening to receive the second power module, and wherein the power supply system is configured such that either the first power module or the second power module may be removed from the frame while the power supply system is operating.

8. The supply system of claim 7, wherein the frame includes a third opening to receive the first controller and a fourth opening to receive the second controller and wherein the frame includes a backplane having a first connector that mates with a connector on the first controller and the backplane has a second connector that mates with a connector on the second controller.

9. The supply system of claim 8, wherein each of the power modules is constructed and arranged to select one of the battery power and the input power as a source for generating the output power.

10. The power supply system of claim 1, further comprising a display module, coupled to the first controller and the second controller, the display module being adapted to display status information to a user of the power supply system.

11. The power supply system of claim 10, wherein the first controller functions as a primary display controller and provides the status information to the display module, and the second controller functions as a redundant display controller and provides status information to the display module upon failure of the first controller.

12. The power supply system of claim 1, further comprising a communications port, coupled to the first controller and the second controller, for providing communications between the power supply system and external devices.

13. The power supply system of claim 12, wherein the first controller functions as a primary communications controller and provides control of communications through the communications port, and the second controller functions as a redundant communications controller that provides control of communications through the communications port upon failure of the first controller.

14. The power supply system of claim 1, further comprising a frame having a first opening to receive the first power module and a second opening to receive the second power module, and wherein the power supply system is configured such that either the first power module or the second power module may be removed from the frame while the power supply system is operating.

15. The supply system of claim 14, wherein the frame includes a third opening to receive the first controller and a fourth opening to receive the second controller and wherein the frame includes a backplane having a first connector that mates with a connector on the first controller and the backplane has a second connector that mates with a connector on the second controller.

16. A power supply system comprising:
    a power input to receive input power from a power source;
    a power output to provide power to a load;
    a communications module having a communications port;
    at least one battery that provides backup power;
    a first power module coupled to the power input, the power output and the battery to provide power to the load;
    a second power module coupled to the power input, the power output and the battery to provide power to the load;
    a first controller electrically coupled to the first power module and to the communications module; and
    a second controller electrically coupled to the second power module, the first controller, and the communications module;
    wherein one of the first controller and the second controller functions as a primary communications controller to control and monitor the communications module.

17. The power supply system of claim 16, wherein the second controller is configured as a redundant controller that controls and monitors the communications module upon failure of the first controller.

18. The power supply system of claim 17 further comprising a display module coupled to the first controller and the second controller, wherein the display module is controlled by the primary controller, and wherein the display module is controlled by the redundant controller upon failure of the primary controller.

19. A power supply system comprising:
- a power input to receive input power from a power source;
- a power output to provide power to a load;
- at least one battery that provides backup power;
- a first power module coupled to the power input, the power output and the battery to provide power to the load;
- a second power module coupled to the power input, the power output and the battery to provide power to the load;
- a first controller electrically coupled to the first power module;
- a second controller electrically coupled to the second power module and the first controller; and
- means for distributing control of functions of the power supply system between the first controller and the second controller.

20. The power supply system of claim 19, wherein the second controller is configured as a redundant controller and the means for distributing includes means for detecting a fault in the first controller and changing control of the power supply system from the first controller to the second controller.

* * * * *

UNITED STATES PATENT AND TRADEMARK OFFICE
CERTIFICATE OF CORRECTION

PATENT NO. : 6,201,319 B1
DATED : March 13, 2001
INVENTOR(S) : James M. Simonelli et al.

It is certified that error appears in the above-identified patent and that said Letters Patent is hereby corrected as shown below:

<u>Column 20,</u>
Line 15, after "first controller", insert -- and changing control of the power supply system from the first controller --.

Signed and Sealed this

Twenty-first Day of August, 2001

Attest:

*Nicholas P. Godici*

Attesting Officer

NICHOLAS P. GODICI
*Acting Director of the United States Patent and Trademark Office*